United States Patent
He et al.

(10) Patent No.: US 8,720,062 B2
(45) Date of Patent: May 13, 2014

(54) MOLDING METHOD FOR A THIN-PROFILE COMPOSITE CAPILLARY STRUCTURE

(75) Inventors: Sin-Wei He, Chu Pei (TW); Jhong-Yan Chang, Chu Pei (TW); Yen-Chen Chen, Chu Pei (TW)

(73) Assignee: Forcecon Technology Co., Ltd., Chu Pei, Hsin Chu Hsien (TW)

( * ) Notice: Subject to any disclaimer, the term of this patent is extended or adjusted under 35 U.S.C. 154(b) by 257 days.

(21) Appl. No.: 13/346,261

(22) Filed: Jan. 9, 2012

(65) Prior Publication Data
US 2013/0174958 A1    Jul. 11, 2013

(51) Int. Cl.
*B21D 53/02*    (2006.01)

(52) U.S. Cl.
USPC .................. 29/890.032; 165/104.26; 427/191

(58) Field of Classification Search
USPC .......................... 29/890.032; 156/62.2, 89.11; 165/104.26; 427/191
See application file for complete search history.

(56) References Cited

U.S. PATENT DOCUMENTS

| | | | |
|---|---|---|---|
| 4,196,504 A * | 4/1980 | Eastman .................. | 29/890.032 |
| 4,885,129 A * | 12/1989 | Leonard et al. ................... | 419/2 |
| 5,101,560 A * | 4/1992 | Leonard et al. .......... | 29/890.032 |
| 7,527,762 B2 * | 5/2009 | Hou et al. .......................... | 419/8 |
| 2006/0179653 A1 * | 8/2006 | Sun et al. ................. | 29/890.032 |
| 2006/0207750 A1 * | 9/2006 | Chang et al. .............. | 165/104.26 |
| 2006/0213061 A1 * | 9/2006 | Wu et al. .................. | 29/890.032 |
| 2007/0044308 A1 * | 3/2007 | Chen ......................... | 29/890.032 |
| 2009/0139696 A1 * | 6/2009 | Shih et al. ................ | 165/104.26 |
| 2012/0048516 A1 * | 3/2012 | He et al. .................... | 165/104.26 |
| 2013/0174966 A1 * | 7/2013 | He et al. ..................... | 156/89.11 |

* cited by examiner

*Primary Examiner* — Alexander P Taousakis
(74) *Attorney, Agent, or Firm* — Egbert Law Offices, PLLC

(57) ABSTRACT

A molding method for a thin-profile composite capillary structure includes the steps of preparing a metal grid and metal powder separately; attaching a liquid medium onto the metal grid by means of spraying or brushing or steeping; attaching uniformly the metal powder onto the grid with the liquid medium; and fixing the metal powder onto the surface of the grid by means of sintering, such that a sintered powder layer is formed onto the surface of the grid. The structure includes a metal grid, which is of planar grid pattern made of woven metal wires. A sintered powder layer is sintered onto a lateral surface of the metal grid from the metal powder. The thickness of the sintered powder layer is 0.1 mm-0.7 mm. The total thickness of the thin-profile composite capillary structure is 0.2 mm-0.8 mm, thus presenting flexibility. The thin-profile composite capillary structure is particularly suitable for a heat pipe.

9 Claims, 11 Drawing Sheets

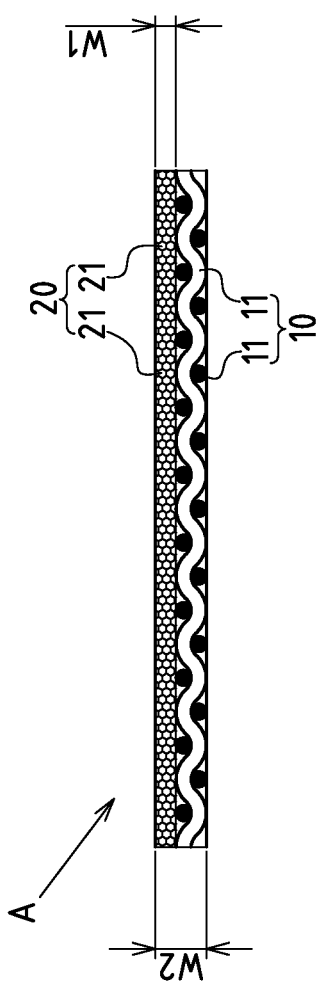
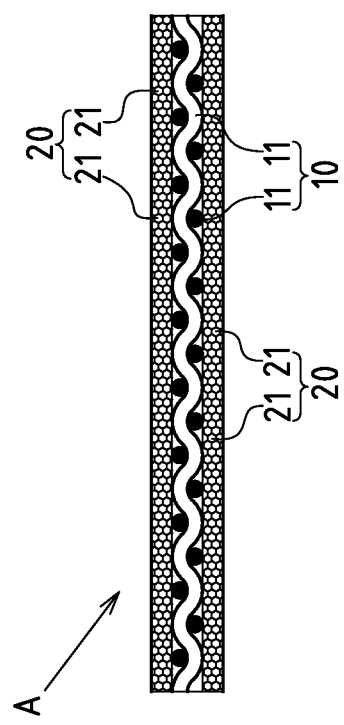

```
┌─────────────────────────────────────────────────────────────┐
│ Seal firstly one end of the heat pipe, with an opening set  │
│ at the other end                                            │
└─────────────────────────────────────────────────────────────┘
                              │
                              ▼
┌─────────────────────────────────────────────────────────────┐
│ Prepare a guiding core rod, and insert into the inner space │
│ of the heat pipe from the opening                           │
└─────────────────────────────────────────────────────────────┘
                              │
                              ▼
┌─────────────────────────────────────────────────────────────┐
│ Permit the thin-profile composite capillary structure to lean│
│ against or abut onto the guiding core rod                   │
└─────────────────────────────────────────────────────────────┘
                              │
                              ▼
┌─────────────────────────────────────────────────────────────┐
│ Put the thin-profile compsoite capillary sturcture into the │
│ inner space of the heat pipe along with the guiding core    │
│ rod inserted into the inner space of the heat pipe          │
└─────────────────────────────────────────────────────────────┘
                              │
                              ▼
┌─────────────────────────────────────────────────────────────┐
│ Allow the thin-profile composite capillary structure to abut│
│ onto the wall of the heat pipe using the guiding core rod   │
└─────────────────────────────────────────────────────────────┘
                              │
                              ▼
┌─────────────────────────────────────────────────────────────┐
│ Draw out the guiding core rod, so that the thin-profile     │
│ composite capillary structure is set into the inner space of│
│ the heat pipe                                               │
└─────────────────────────────────────────────────────────────┘
```

FIG.13

MOLDING METHOD FOR A THIN-PROFILE COMPOSITE CAPILLARY STRUCTURE

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to a capillary structure, and more particularly to an innovative one which is fabricated by a specific molding method.

2. Description of Related Art Including Information Disclosed Under 37 CFR 1.97 and 37 CFR 1.98

The common heat tube is structurally designed with a composite capillary structure to enhance its thermal conductivity. Despite the improved thermal conductivity of heat pipe with introduction of such composite capillary structure, some problems remain unchanged with varying space configurations of the heat pipe.

There is a growing trend wherein thin-profile, compact heat pipes are developed in response to lightweight, thin-profile computer and electronic equipments. However, some problems will be encountered by the composite capillary structure preset into the inner space of the heat pipe, owing to the fact that, as for fabrication of the composite capillary structure of the common heat pipe, a core rod is generally inserted into the heat pipe as a fixture, then metal powder is filled into the gap between the core rod and heat pipe wall and finally sintered into a fixed body. However, it is found during actual fabrication that the metal powder could not get thinner in the powder filling process due to an extremely small gap. Further, it is difficult to compact the powder with the growing length of the heat pipe. Once the powder sintered body becomes thicker, the steam flow channel is insufficient, in particular when the cross section of the heat pipe becomes smaller to some extent that the powder sintered body occupies a relatively bigger cross section.

The other problem for common heat pipe's composite capillary structure is that if the powder sintered body and the grid are sintered onto the heat pipe, the flexibility is almost lost. When the heat pipe is pressed into a flat or a bent pipe, the corresponding composite capillary structure could not be adapted flexibly, so the composite capillary structure is disengaged from the heat pipe wall. This phenomenon will lead to blocking or jamming of the steam flow channel, thus affecting seriously the flow smoothness of working fluid and the heat-dissipation efficiency of the heat pipe.

Thus, to overcome the aforementioned problems of the prior art, it would be an advancement if the art to provide an improved structure that can significantly improve the efficacy.

Therefore, the inventor has provided the present invention of practicability after deliberate design and evaluation based on years of experience in the production, development and design of related products.

BRIEF SUMMARY OF THE INVENTION

Based on the design of the present invention wherein the composite capillary structure comprises metal grid and sintered powder layer, with its total thickness of 0.2 mm-0.8 mm, a more compact and thin-profile heat pipe can be fabricated due to the compactness and flexibility of the composite capillary structure. This overcomes the problems of bigger thickness of powder sintered body and insufficient steam flow channel, and further increases the cross section of heat pipe's steam flow channel to improve the steam flow efficiency.

Due to the compactness (0.2 mm-0.8 mm) and flexibility of the thin-profile composite capillary structure, the composite capillary structure and heat pipe can be maintained in an excellent mating state in tune with flexible processing of pipe wall.

As the present invention allows the metal powder to be attached onto the metal grid with the liquid medium and then fix it by means of sintering, the fabrication is made easy to obtain a thin-profile sintered powder layer.

Although the invention has been explained in relation to its preferred embodiment, it is to be understood that many other possible modifications and variations can be made without departing from the spirit and scope of the invention as hereinafter claimed.

BRIEF DESCRIPTION OF THE SEVERAL VIEWS OF THE DRAWINGS

FIG. 4 is a structural view of the present invention showing the cross section of the preferred embodiment of the thin-profile composite capillary structure.

FIG. 5 is a structural view of the present invention showing the cross section of the preferred embodiment of the thin-profile composite capillary structure.

FIG. 13 is a chart of the present invention showing the mating method of the thin-profile composite capillary structure with the heat pipe.

DETAILED DESCRIPTION OF THE INVENTION

Figure 1:
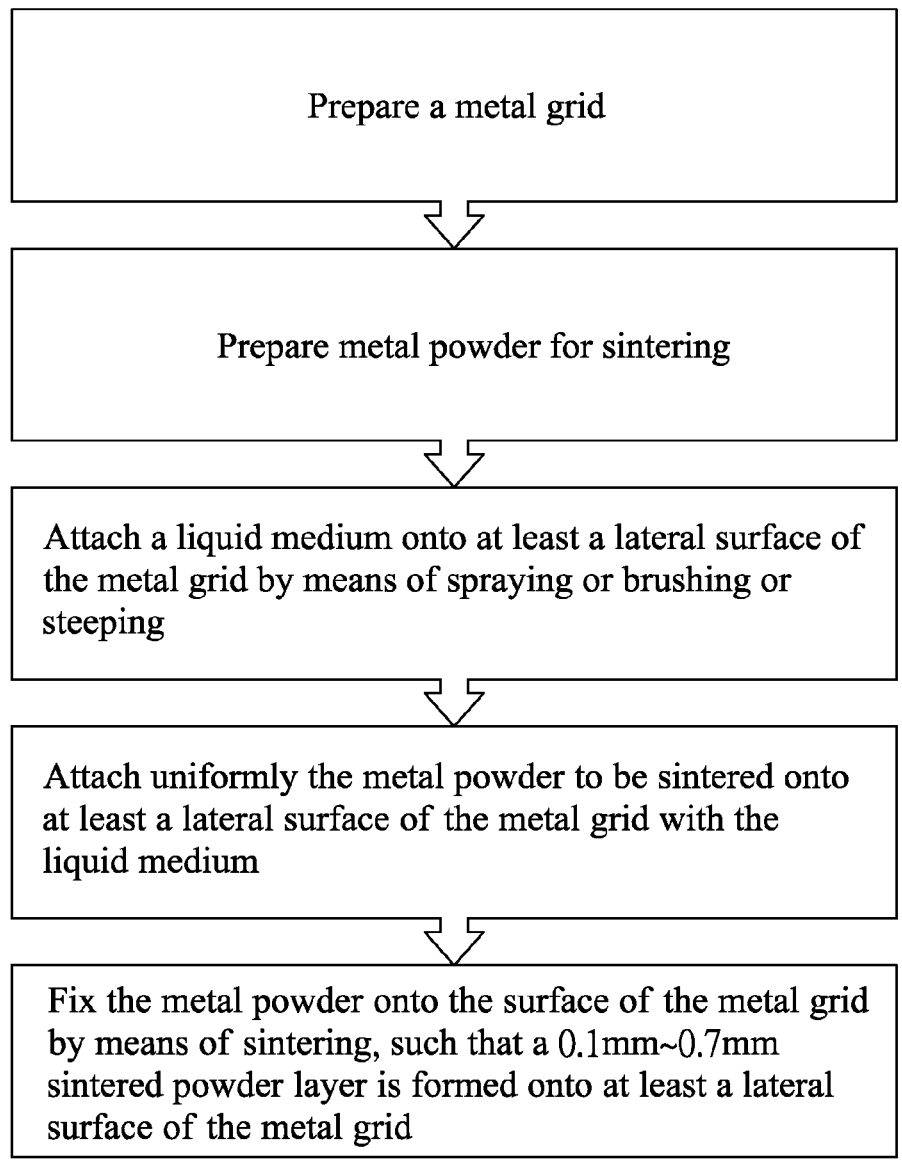
FIG. 1 is a text block chart of the present invention showing the molding method of the thin-profile composite capillary structure.
Figure 2:
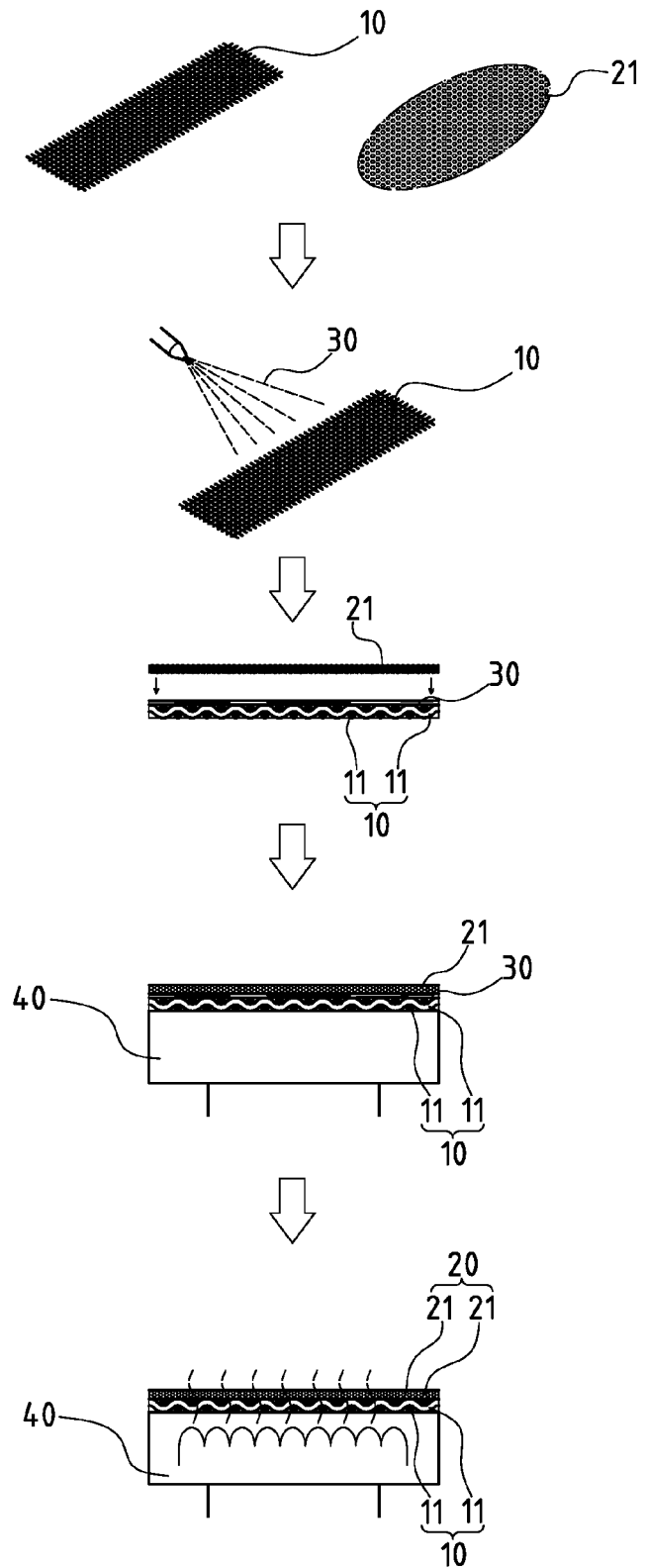
FIG. 2 is a schematic view of the present invention showing the molding method of the thin-profile composite capillary structure.
Figure 3:
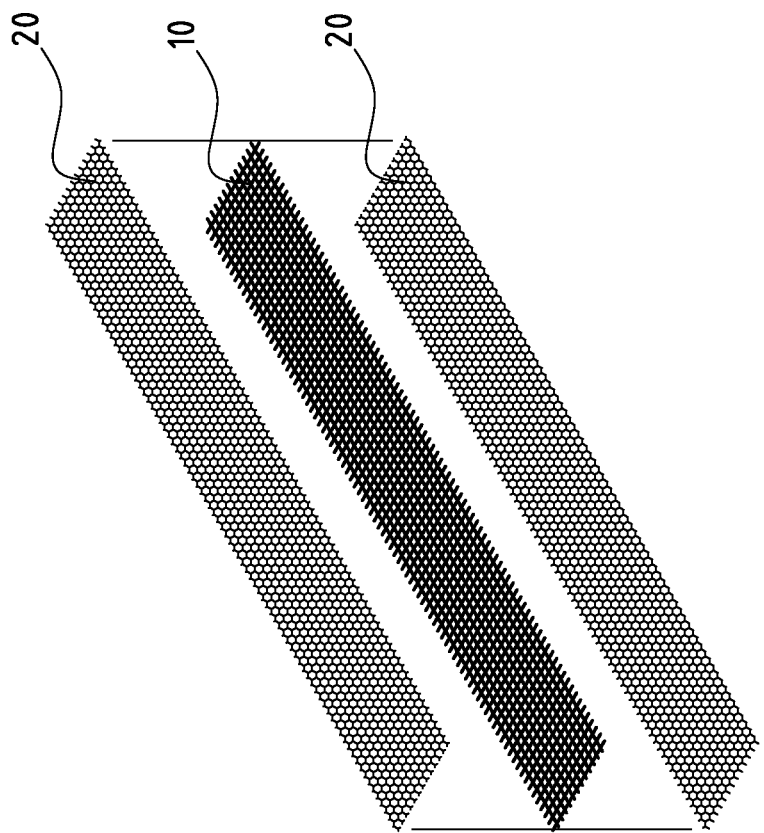
FIG. 3 is an exploded perspective view of the thin-profile composite capillary structure of the present invention.
Figure 15:
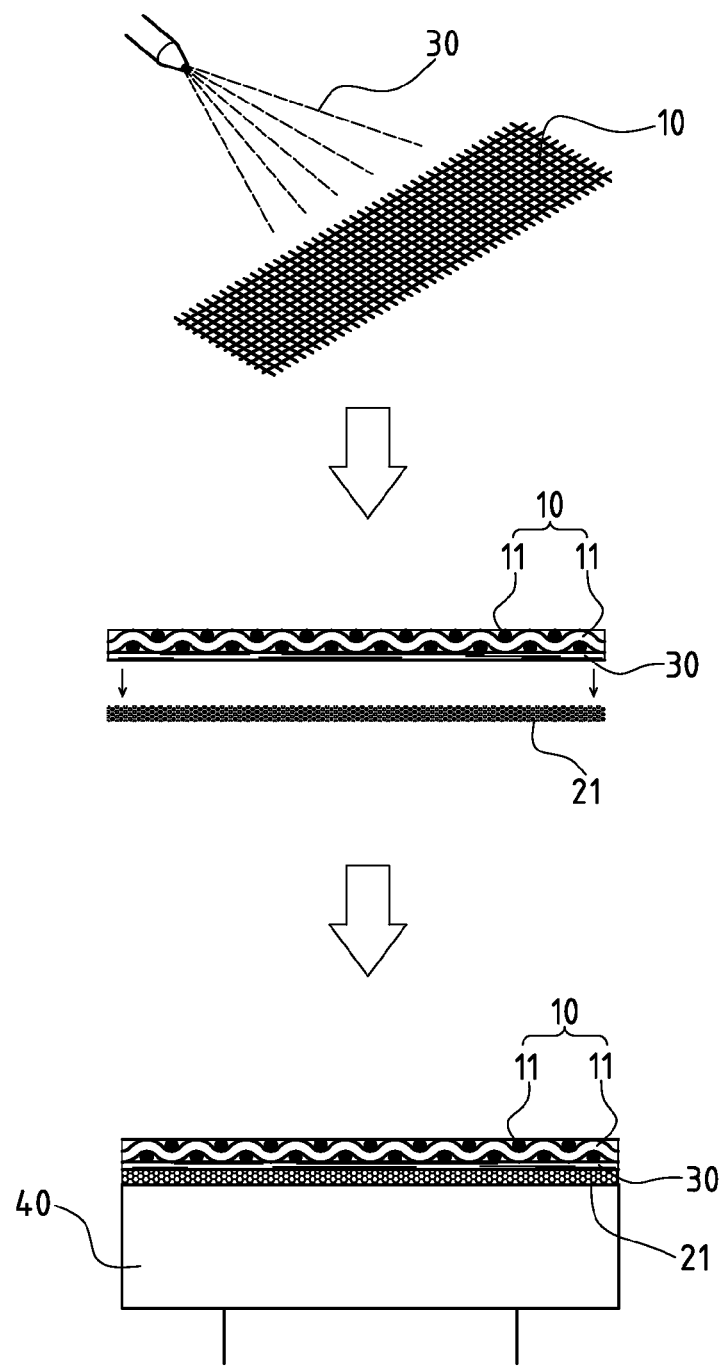
FIG. 15 is a schematic view of another preferred embodiment of the present invention wherein the metal powder is attached onto the thin-profile composite capillary structure.

FIGS. 1 and 2 depict preferred embodiments of the molding method of the composite capillary structure of the present invention, which, however, are provided for only explanatory objective for patent claims. Said thin-profile composite capillary structure A is fabricated by the following molding methods:

A. prepare a metal grid 10;
B. prepare metal powder 21 for sintering;
C. attach a liquid medium 30 onto at least a lateral surface of the metal grid 10 by means of spraying or brushing or steeping (shown in FIG. 15);
D. attach uniformly the metal powder 21 to be sintered onto at least a lateral surface of the metal grid 10 with the liquid medium 30;
E. fix the metal powder 21 onto the surface of the metal grid 10 by means of sintering, such that a 0.1 mm-0.7 mm sintered powder layer 20 is formed onto at least a lateral surface of the metal grid 10.

Of which, the liquid medium 30 is selected from water, adhesive or organic solvent (e.g.: methanol, ethanol and acetone).

Referring to FIG. 2, the adhesiveness and smoothness of the sintered powder layer 20 could be increased in the sintering process via the help of a fixture 40 (or mold or holding device).

Figure 6:
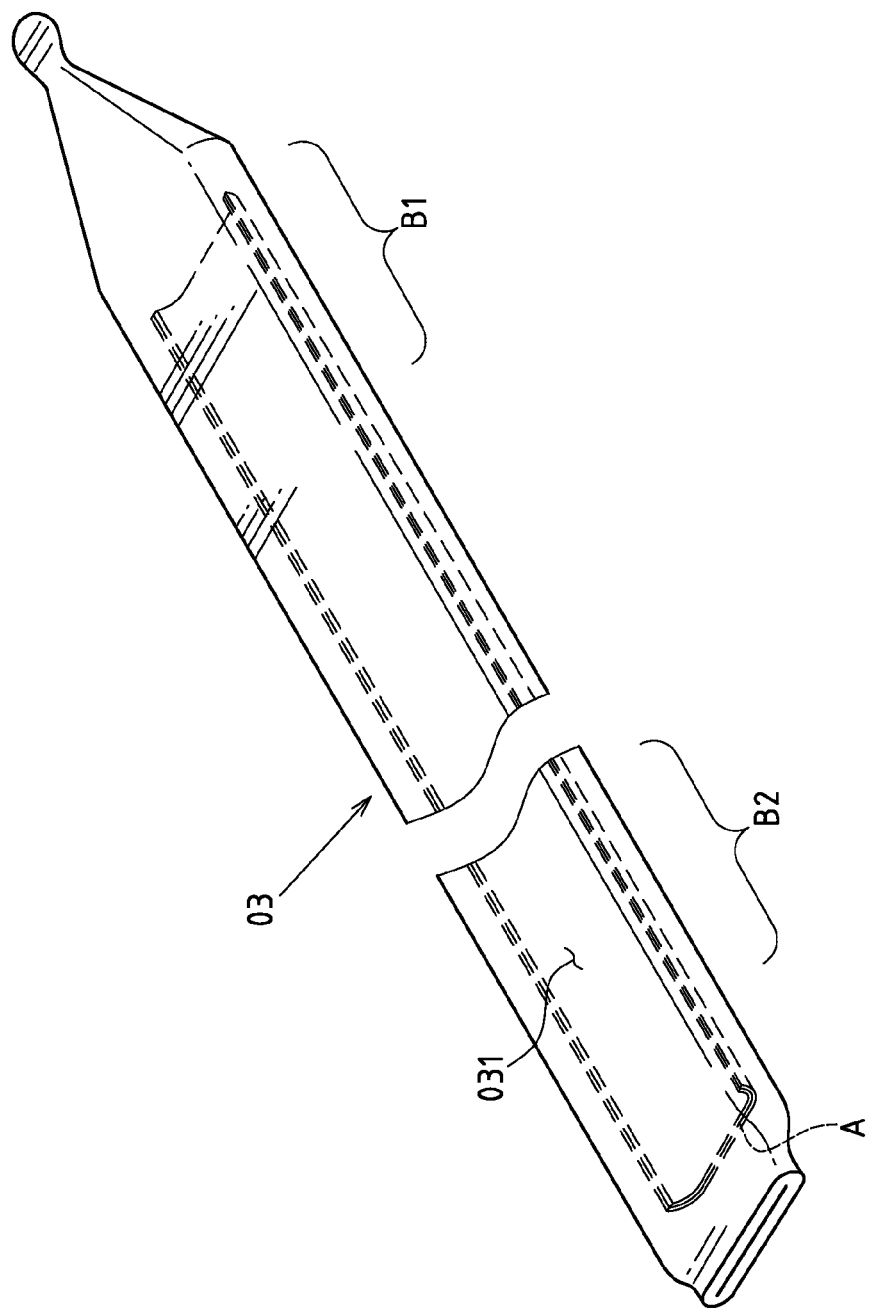
FIG. 6 is a perspective view of the present invention showing the flat heat pipe of thin-profile composite capillary structure.

Referring also to FIGS. 4-6, said thin-profile composite capillary structure A comprises a metal grid 10, which is of planar grid pattern made of woven metal wires 11. The metal grid 10 comprises of two lateral surfaces.

At least a sintered powder layer 20 is sintered onto at least a lateral surface of the metal grid 10 from the metal powder 21 (shown in FIG. 4; the preferred embodiment with the metal powder 21 sintered onto two lateral surfaces shown in FIG. 5). The thickness W1 of the sintered powder layer 20 is 0.1 mm-0.7 mm (shown in FIG. 4).

Referring to FIG. 4, the total thickness W2 of the thin-profile composite capillary structure A formed by the metal grid 10 and sintered powder layer 20 is 0.2 mm-0.8 mm.

Of which, the thin-profile composite capillary structure A formed by the metal grid 10 and sintered powder layer 20 still presents flexibility.

Figure 7:
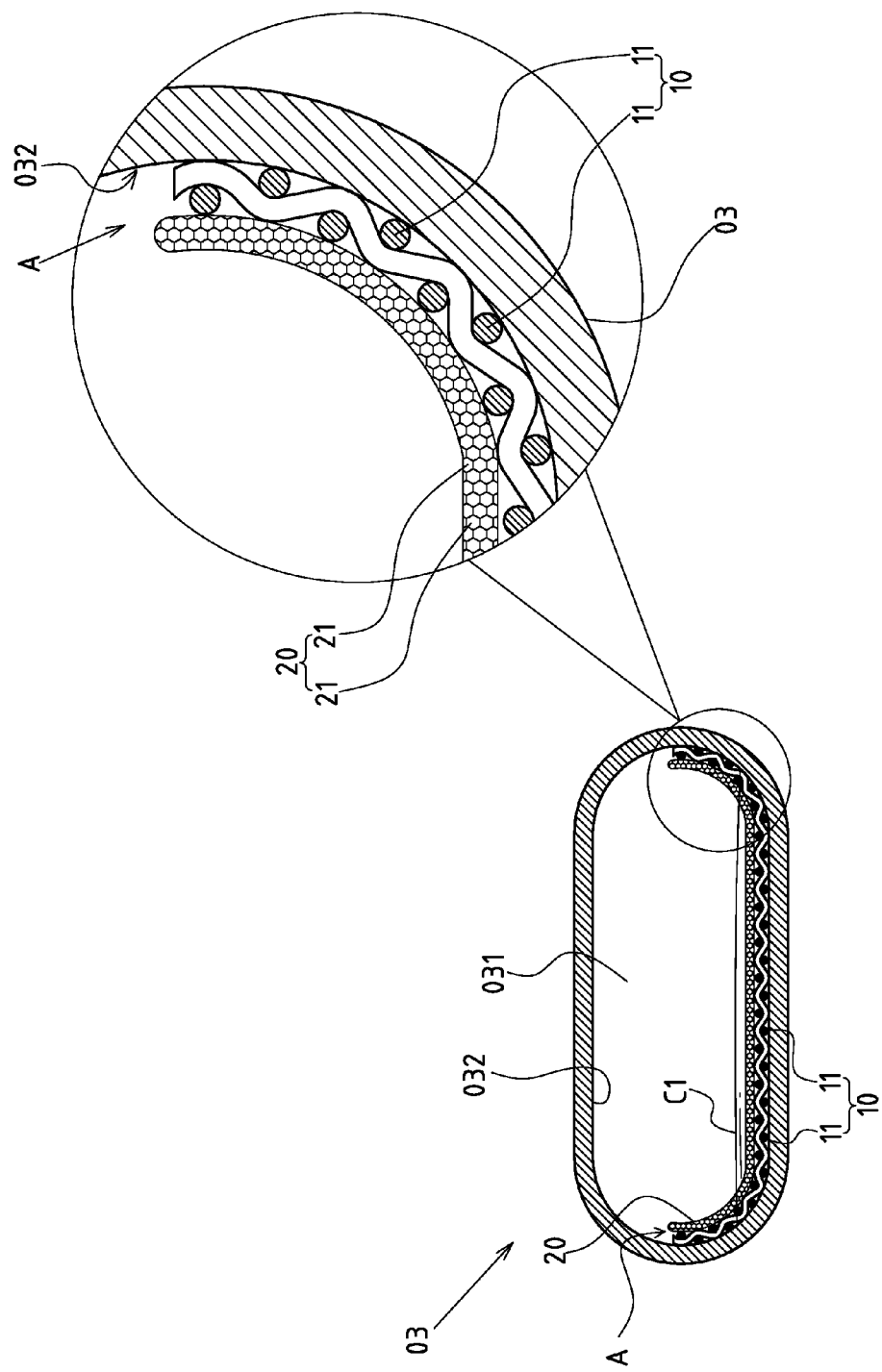
FIG. 7 is a partially enlarged sectional view of the present invention showing the flat heat pipe of thin-profile composite capillary structure.
Figure 8:
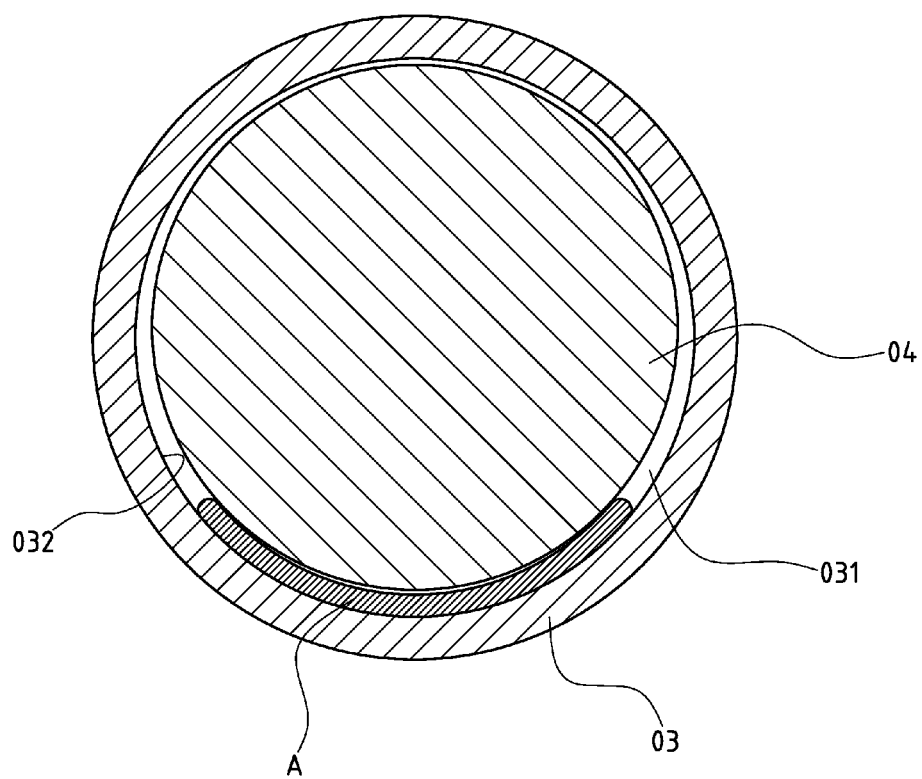
FIG. 8 is a schematic view of the present invention wherein the thin-profile composite capillary structure is arranged on the wall of round heat pipe.
Figure 9:
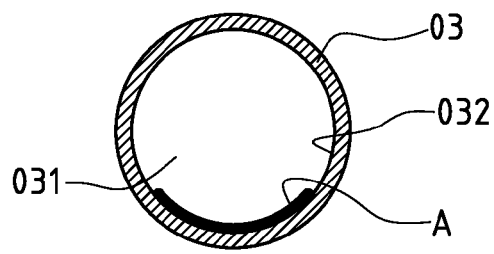
FIG. 9 is a schematic view of the present invention wherein the thin-profile composite capillary structure is arranged on the wall of heat pipe.
Figure 10:
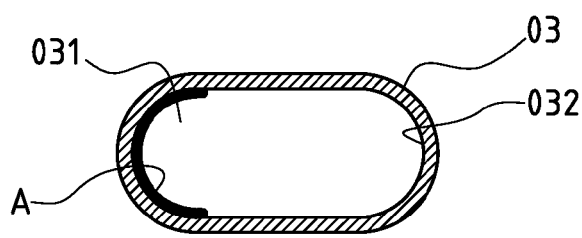
FIG. 10 is a schematic view of the present invention wherein the thin-profile composite capillary structure is arranged on the wall of heat pipe.
Figure 11:
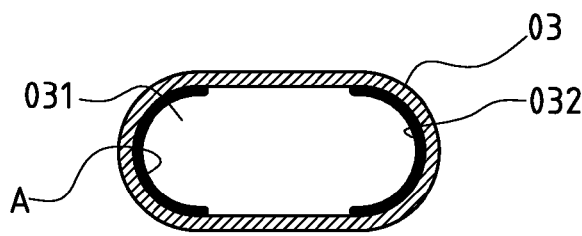
FIG. 11 is a schematic view of the present invention wherein the thin-profile composite capillary structure is arranged on the wall of heat pipe.
Figure 12:
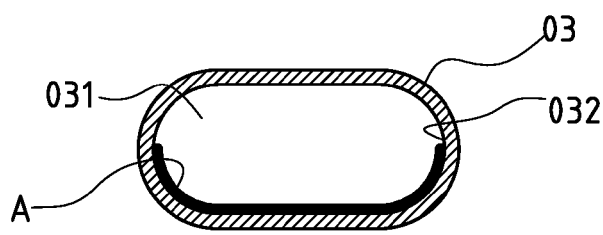
FIG. 12 is a schematic view of the present invention wherein the thin-profile composite capillary structure is arranged on the wall of heat pipe.

Referring to FIGS. 6 and 7, said thin-profile composite capillary structure A of the present invention is particularly suitable for capillary structure in the heat pipe 03. As for a flat heat pipe 03 with two closed ends, a hollow but closed inner space 031 is thus formed, while a condensation section B1 and evaporation section B2 are contained (only marked in FIG. 6) Inner space 031 of the heat pipe 03 is vacuumed and filled with working fluid C1. Said thin-profile composite capillary structure A is set into the inner space 031 of the heat pipe 03, and comprised of condensation section B1 and evaporation section B2. Of which, the thin-profile composite capillary structure A formed by the metal grid 10 and sintered powder layer 20 still presents flexibility.

Referring to FIGS. 8-12, the wall 032 of the heat pipe 03 is of round or flat cross section or a combination of round and flat patterns (e.g.: a round heat pipe is partially set into flat pattern).

Referring also to FIGS. 8-12, the thin-profile composite capillary structure A is arranged globally, sectionally or partially onto the wall 032 of the heat pipe 03. The thin-profile composite capillary structure A arranged globally onto the wall 032 of the heat pipe 03 is not illustrated in the preferred embodiment.

Of which, the thin-profile composite capillary structure A and the wall 032 of the heat pipe 03 can be fixed by means of sintering.

Figure 14:
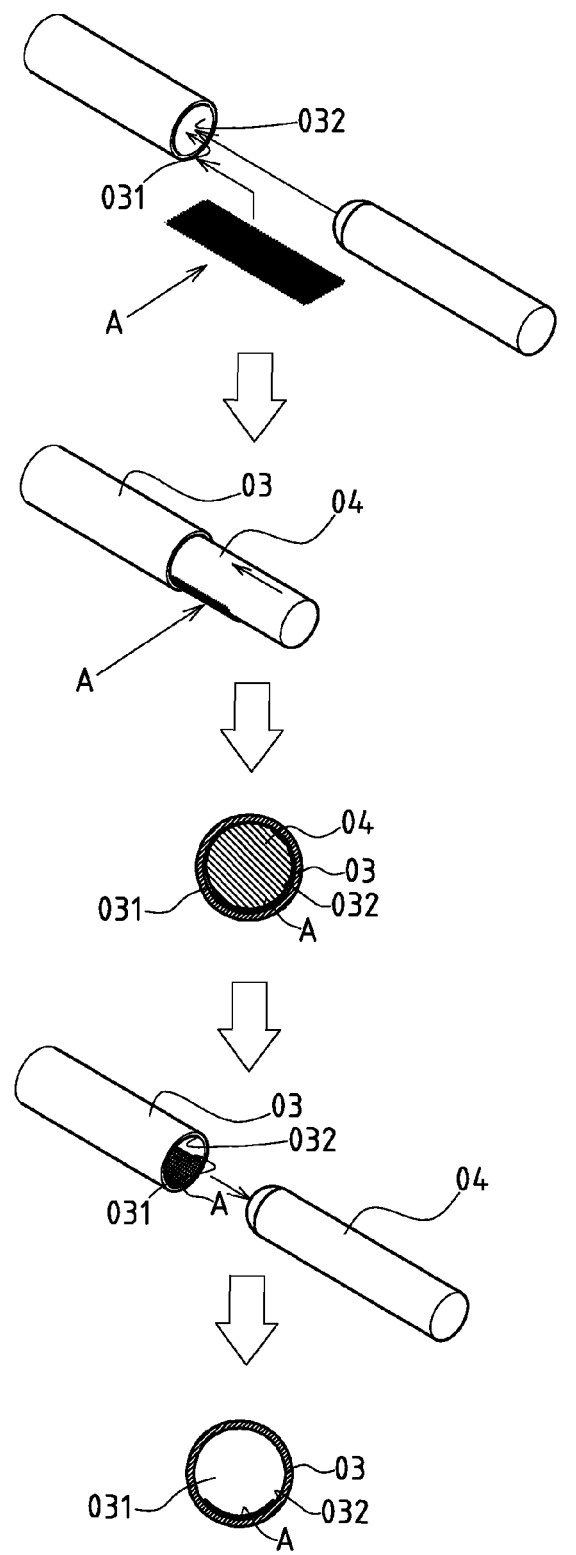
FIG. 14 is a schematic view of the present invention showing the mating steps of the thin-profile composite capillary structure with the heat pipe.

Referring to FIGS. 13 and 14, the thin-profile composite capillary structure A and the heat pipe 03 are mated by the following steps:

A. seal firstly one end of the heat pipe 03, with an opening set at the other end;
B. prepare a guiding core rod 04, and insert into the inner space 031 of the heat pipe 03 from the opening;
C. permit the thin-profile composite capillary structure A to lean against or abut onto the guiding core rod 04;
D. put the thin-profile composite capillary structure A into the inner space 031 of the heat pipe 03 along with the guiding core rod 04 inserted into the inner space 031 of the heat pipe 03;
E. allow the thin-profile composite capillary structure A to abut onto the wall 032 of the heat pipe 03 using the guiding core rod 04;
F. draw out the guiding core rod 04, so that the thin-profile composite capillary structure A is set into the inner space 031 of the heat pipe 03.

After the thin-profile composite capillary structure A is abutted onto the wall 032 of the heat pipe 03 using the guiding core rod 04, a sintering process enables to fix the thin-profile composite capillary structure A with the wall 032 of the heat pipe 03.

We claim:

1. A molding method for forming a thin-profile composite capillary structure having a thickness of between 0.2 millimeters and 0.8 millimeters, the molding method comprising:
preparing a metal grid outside of a heat pipe;
preparing a metal powder suitable for sintering outside of the heat pipe;
attaching a liquid medium outside of the heat pipe onto at least one lateral surface of said metal grid by either spraying, brushing or steeping;
uniformly attaching said metal powder onto the lateral surface of said metal grid with said liquid medium outside of the heat pipe, said liquid medium selected from the group consisting of water, an adhesive and an organic solvent;
supporting the metal grid onto a surface of a fixture; and
fixing said metal powder onto the surface of said metal grid outside of the heat pipe by sintering such that a sintered powder layer having a thickness of between 0.1 millimeters and 0.7 millimeters is formed on the lateral surface of said metal grid.

2. The molding method of claim 1, wherein the heat pipe has a closed inner space with opposing closed ends, the heat pipe having a condensation section and evaporation section, the closed inner space being in a vacuum condition and filled with a working fluid.

3. The molding method of claim 1, the heat pipe having a round cross section.

4. The molding method of claim 1, the heat pipe having a flat cross section.

5. The molding method of claim 1, the heat pipe having a combination of round and flat shapes.

6. The molding method of claim 1, further comprising:
affixing the thin profile composite capillary structure onto an inner wall of the heat pipe.

7. The molding method of claim 6, the step of affixing comprising:
affixing the thin profile composite capillary structure to the inner wall of the heat pipe by sintering.

8. The molding method of claim 2, further comprising:
sealing one end of the heat pipe so as to leave one open end;
preparing a guiding core rod;
applying the thin profile composite capillary structure onto guiding core rod;
inserting said guiding core rod into said closed inner space of the heat pipe through the open end;
abutting the thin profile composite capillary structure against a wall of the heat pipe by urging the guiding core rod against the wall of the heat pipe; and
drawing the guiding core rod outwardly of said inner space of said heat pipe through said opening such that the thin profile composite capillary structure is set within said inner space of said heat pipe.

9. The molding method of claim 8, further comprising:
sintering the thin profile composite capillary structure onto the wall of the heat pipe.

* * * * *